(12) United States Patent
Rhyee et al.

(10) Patent No.: US 8,933,318 B2
(45) Date of Patent: Jan. 13, 2015

(54) THERMOELECTRIC MATERIAL, AND THERMOELECTRIC MODULE AND THERMOELECTRIC DEVICE INCLUDING THE THERMOELECTRIC MATERIAL

(75) Inventors: Jong-soo Rhyee, Suwon-si (KR); Sang-mock Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 294 days.

(21) Appl. No.: 13/077,314

(22) Filed: Mar. 31, 2011

(65) Prior Publication Data
US 2011/0240083 A1 Oct. 6, 2011

(30) Foreign Application Priority Data

Mar. 31, 2010 (KR) .................. 10-2010-0029348

(51) Int. Cl.
*H01L 35/14* (2006.01)
*H01B 1/04* (2006.01)
*H01B 1/02* (2006.01)
*H01L 35/22* (2006.01)
*C01B 19/00* (2006.01)
*C22C 1/04* (2006.01)
*C22C 28/00* (2006.01)
*H01L 35/16* (2006.01)

(52) U.S. Cl.
CPC .............. *H01L 35/22* (2013.01); *C01B 19/007* (2013.01); *C22C 1/04* (2013.01); *C22C 28/00* (2013.01); *H01L 35/16* (2013.01); *C01P 2006/40* (2013.01)
USPC ........ 136/236.1; 136/238; 136/239; 136/240; 136/241; 136/503

(58) Field of Classification Search
USPC ....................................... 136/236.1
See application file for complete search history.

(56) References Cited

U.S. PATENT DOCUMENTS 6,369,314 B1 * 4/2002 Nolas ........................ 136/201
7,374,817 B2 5/2008 Tanda et al.
(Continued)

FOREIGN PATENT DOCUMENTS

| CN | 1074249 A | 7/1993 |
| JP | 1999-150307 A | 6/1999 |
| JP | 2002-026400 A | 1/2002 |

(Continued)

OTHER PUBLICATIONS

Deguchi et al., "Magnetic order of rare-earth tritelluride CeTe3 at low temperature", Journal of Physics: Conference Series, vol. 150, (2009), doi:10.1088/1742-6596/150/042023, pp. 1-4.*
(Continued)

*Primary Examiner* — Jeffrey T Barton
*Assistant Examiner* — Tae-Sik Kang
(74) *Attorney, Agent, or Firm* — Cantor Colburn LLP

(57) ABSTRACT

A thermoelectric material including a compound represented by Formula 1 below:

$$(R_{1-a}R'_a)(T_{1-b}T'_b)_{3\pm y} \quad \text{Formula 1}$$

wherein R and R' are different from each other, and each includes at least one element selected from a rare-earth element and a transition metal, T and T' are different from each other, and each includes at least one element selected from sulfur (S), selenium (Se), tellurium (Te), phosphorus (P), arsenic (As), antimony (Sb), bismuth (Bi), carbon (C), silicon (Si), germanium (Ge), tin (Sn), boron (B), aluminum (Al), gallium (Ga), and indium (In), $0 \le a \le 1$, $0 \le b \le 1$, and $0 \le y < 1$.

17 Claims, 8 Drawing Sheets

(56) References Cited

U.S. PATENT DOCUMENTS

2002/0117467 A1    8/2002  Tanda et al.
2009/0250651 A1*  10/2009  Rhyee et al. .............. 252/62.3 T

FOREIGN PATENT DOCUMENTS

| JP | 2004-076046 A | 3/2004 |
| KR | 1020090026665 A | 3/2009 |
| KR | 1020090106320 A | 10/2009 |
| KR | 1020090116137 A | 11/2009 |
| KR | 1020100009455 A | 1/2010 |
| KR | 1020100081914 A | 7/2010 |
| WO | 9308981 | 5/1993 |

OTHER PUBLICATIONS

Deguchi, K. et al., Magnetic order of rare-earth tritelluride CeTe3 at low temperature, J. Phys.: Conf. Ser. 150, 2009, 042023.

Hamlin, J.J. et al., Pressure-Induced Superconducting Phase in the Charge-Density-Wave Compound Terbium Tritelluride, Phys. Rev. Lett. 102, 2009, 177002.

Laverock, J. et al., Fermi surface nesting and charge-density wave formation in rare-earth tritellurides, Phys. Rev. B 71, 2005, 085114.

Srivastava, S. K. et al., Review: Preparation, structure and properties of transition metal trichalcogenides, J. of Materials Science, 1992, vol. 27(14): 3693-3705.

Zocco, D. A. et al. "Pressure dependence of electronic ground states in f-electron materials", ARW Workshop on Correlated Thermoelectrics: Properties and Applications of Thermoelectric Materials, Sep. 2008. Abstract.

Esseni et al., "Theory of the motion at the band crossing points in bulk semiconductor crystals and in inversion layers", Journal of Applied Physics, vol. 105, 2009, pp. 053702-1-053702-11.

Kawaharada et al, "Thermoelectric properties of CoSb3", Journal of Alloys and Compounds, vol. 315, 2001, pp. 193-197.

Rhyee et al., "Peierls distortion as a route to high thermoelectric performance in In4Se3-d crystals", Nature, vol. 459, Jun. 18, 2009, pp. 965-968.

Shin et al, "Electronic structure and charge-density wave formation in LaTe1.95 and CeTe2.00", Physical Review, B 72, 2005, pp. 085132-1-085132-9.

Chinese Office action for Chinese Patent Application No. 2011800171508 dated Feb. 26, 2014 with English Translation.

Japanese Office action for Japanese Patent Application No. 2013-502486 dated Jan. 28, 2014 with English Translation.

* cited by examiner

THERMOELECTRIC MATERIAL, AND THERMOELECTRIC MODULE AND THERMOELECTRIC DEVICE INCLUDING THE THERMOELECTRIC MATERIAL

CROSS-REFERENCE TO RELATED APPLICATIONS

This application claims priority to Korean Patent Application No. 10-2010-0029348, filed on Mar. 31, 2010, and all the benefits accruing therefrom under 35 U.S.C. §119, the content of which in its entirety is herein incorporated by reference.

BACKGROUND

1. Field

The present disclosure relates to a thermoelectric material having a high performance index, thermoelectric modules including the thermoelectric material, and thermoelectric devices including the thermoelectric modules, and more particularly, to a thermoelectric material having a large Seebeck coefficient, a high electrical conductivity, and a low thermal conductivity, thermoelectric modules including the thermoelectric material, and thermoelectric devices including the thermoelectric modules.

2. Description of the Related Art

In general, thermoelectric materials are used in active cooling and waste heat power generation based on the Peltier effect and the Seebeck effect. The Peltier effect is a phenomenon in which, as illustrated in FIG. 1, holes of a p-type material and electrons of an n-type material move when a DC voltage is applied to the materials, and thus exothermic and endothermic reactions occur at opposite ends of each of the n-type and p-type materials. The Seebeck effect is a phenomenon in which, as illustrated in FIG. 2, holes and electrons move when heat is provided by an external heat source and thus electric current flows in a material, thereby converting a temperature difference into electrical power.

Active cooling using a thermoelectric material improves the thermal stability of a device, does not produce vibration and noise, and use of a separate condenser and refrigerant may be avoided; thus thermoelectric cooling is regarded as an environmentally friendly method of cooling. Active cooling using a thermoelectric material can be applied in refrigerant-free refrigerators, air conditioners, and various micro-cooling systems. In particular, if a thermoelectric device is attached to a memory device, the temperature of the memory device may be maintained at a uniform and stable level while an increase in the entire volume of the memory device and the cooling system is smaller than if a commercially available adiabatic cooling system is used. Thus, use of thermoelectric devices in memory devices may contribute to higher performance.

In addition, when thermoelectric materials are used for thermoelectric power generation based on the Seebeck effect, waste heat may be used as an energy source. Thus the energy efficiency of a vehicle engine, an exhaust device, a waste incinerator, a steel mill, or a medical device power source which uses heat from a human body may be increased, or the waste heat can be collected for use in other applications.

The performance of a thermoelectric material is evaluated using a dimensionless performance index ("ZT") defined by Equation 1.

$$ZT = \frac{S^2 \sigma T}{k} \quad \text{Equation 1}$$

In Equation 1, S is a Seebeck coefficient, σ is an electrical conductivity, T is an absolute temperature, and κ is a thermal conductivity.

To increase the ZT, a material having a large Seebeck coefficient, a high electrical conductivity, and a low thermal conductivity would be desirable.

SUMMARY

Provided is a thermoelectric material having a large Seebeck coefficient, a high electrical conductivity, and a low thermal conductivity.

Provided is a thermoelectric module including a thermoelectric element including the thermoelectric material.

Provided is a thermoelectric device including the thermoelectric module.

Additional aspects will be set forth in part in the description which follows and, in part, will be apparent from the description.

According to an aspect, disclosed is a thermoelectric material including: a compound represented by Formula 1:

$$(R_{1-a}R'_a)(T_{1-b}T'_b)_{3\pm y} \quad \text{Formula 1}$$

wherein

R and R' are different from each other, and each of R and R' includes at least one element selected from a rare-earth element and a transition metal, T and T' are different from each other, and each of T and T' includes at least one element selected from sulfur (S), selenium (Se), tellurium (Te), phosphorus (P), arsenic (As), antimony (Sb), bismuth (Bi), carbon (C), silicon (Si), germanium (Ge), tin (Sn), boron (B), aluminum (Al), gallium (Ga), and indium (In), $0 \leq a \leq 1$, $0 \leq b \leq 1$, and $0 \leq y < 1$.

According to an embodiment, the compound represented by Formula 1 may have a structure having a two-dimensional layered structure.

According to an embodiment, the compound of Formula 1 may have a structure having a double layer formed of T that may be interposed between block layers, and each block layer may be formed of R and T.

According to an embodiment, any one of R and R' may include a rare-earth element.

According to an embodiment, any one of T and T' may include at least one element selected from S, Se, and Te.

According to an embodiment, a may be 0 to about 0.5.
According to an embodiment, b may be 0 to about 0.5.
According to an embodiment, y may be 0 to about 0.5.

According to an embodiment, the compound represented by Formula 1 may be a compound represented by Formula 2 below:

$$(R_{1-a'}R'_{a'})(T_{1-b'}T'_{b'})_{3-y'} \quad \text{Formula 2}$$

wherein R is a rare-earth element, R' is transition metal, T is at least one element selected from S, Se, and Te, T' includes at least one element selected from P, As, Sb, Bi, C, Si, Ge, Sn, B, Al, Ga, and In, $0 \leq a' \leq 1$, $0 \leq b' \leq 1$, and $0 \leq y' \leq 1$.

According to an embodiment, y' may be equal to or greater than 0 and less than or equal to about 0.5.

According to an embodiment, the compound represented by Formula 1 may have a polycrystalline structure or a monocrystalline structure.

According to an embodiment, the thermoelectric material may have a thermal conductivity of about 3.5 Watts per meter Kelvin (W/mK) or less at room temperature.

According to an embodiment, the thermoelectric material may have a Seebeck coefficient of about 10 microvolts per Kelvin (μV/K) or greater at room temperature.

According to another aspect, disclosed is a thermoelectric module including: a first electrode, a second electrode, and a thermoelectric element interposed between the first electrode and the second electrode, wherein the thermoelectric element includes the thermoelectric material described above.

According to another aspect, disclosed is a thermoelectric device including: a heat supply member; and a thermoelectric module including a thermoelectric element which absorbs heat from the heat supply member; a first electrode contacting the thermoelectric element; and a second electrode facing the first electrode and contacting the thermoelectric element, wherein the thermoelectric element includes the thermoelectric material described above.

Also disclosed is a method of manufacturing a thermoelectric material, the method including: combining a first material and a second material to form a combination; and heat treating the combination to form the thermoelectric material, wherein the first material includes R and R', R and R' are different from each other, and each of R and R' includes at least one element selected from a rare-earth element and a transition metal, the second material includes T and T', T and T' are different from each other, and each of T and T' includes at least one element selected from sulfur, selenium, tellurium, phosphorus, arsenic, antimony, bismuth, carbon, silicon, germanium, tin, boron, aluminum, gallium, and indium, and a mole ratio of a sum of R and R' to a sum of T and T' is about 1:2 to about 1:4.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
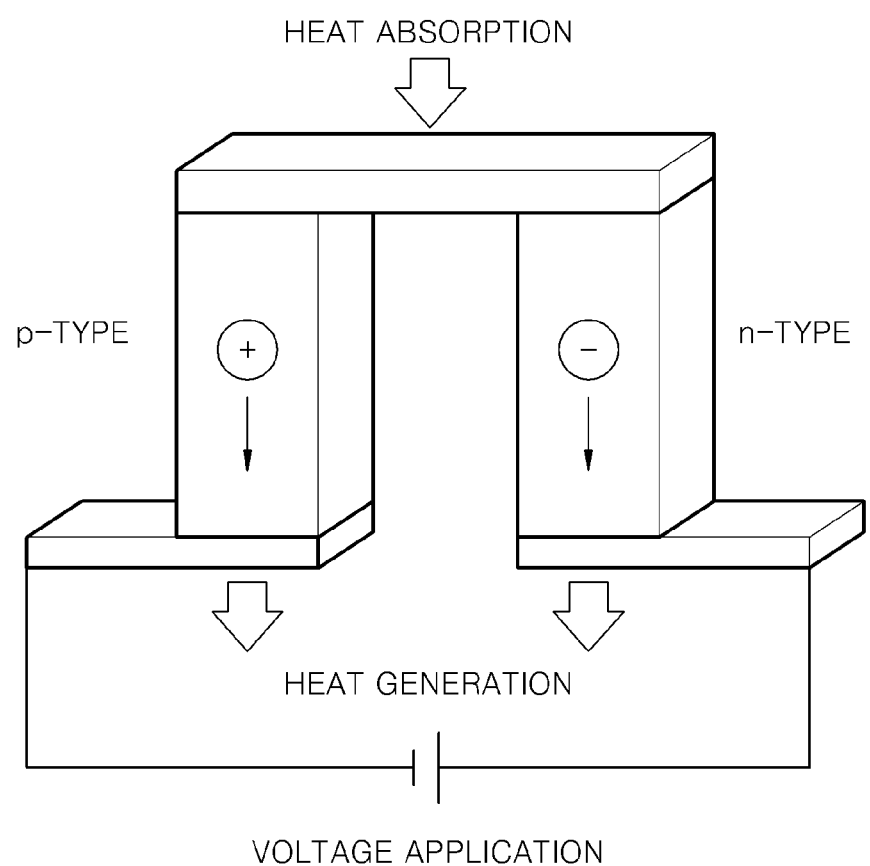
FIG. 1 is a schematic diagram of an embodiment of a thermoelectric cooler using the Peltier effect.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper," or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be disclosed in further detail.

In general, materials having a large Seebeck coefficient, a high electrical conductivity, and a low thermal conductivity $\kappa$ are desirable to provide an improved value of dimensionless performance index ZT. ZT is a factor for evaluating the performance of a thermoelectric material. The thermal conductivity $\kappa$ consists of an electron contribution $\kappa_{el}$ and a phonon contribution $\kappa_{ph}$, wherein phonons are a quantified lattice vibration, as further described in the following Equations.

$$\kappa = \kappa_{el} + \kappa_{ph}$$

$$\kappa_{el} = LT\sigma$$

$$L = \frac{\kappa_{el}}{\sigma T} = \frac{\pi^2}{3}\left(\frac{k_B}{e}\right)^2 = 2.44 \times 10^{-8} W\Omega/K^2$$

In the foregoing equations, k is thermal conductivity, $\kappa_{el}$ is the electron contribution to the thermal conductivity, $\kappa_{ph}$ is phonon contribution to the thermal conductivity, L is a Lorentz factor, $\sigma$ is an electrical conductivity, T is an absolute temperature, and $k_B$ is a Boltzmann constant.

Since $\kappa_{el}$ is proportional to a according to the Wiedemann-Frantz law, $\kappa_{el}$ is a dependent variable of the electrical conductivity. Accordingly, in order to reduce the thermal conductivity, lattice thermal conductivity is desirably reduced. In addition, in order to increase a power factor $S^2\sigma$, which is a product of the square of the Seebeck coefficient and the electrical conductivity, a density of states of electrons desirably has a sharp feature due to a large decrease in an energy band in a vicinity of a Fermi band of a solid.

In order to obtain a low thermal conductivity and a high power factor, a thermoelectric material according to an embodiment includes a compound represented by Formula 1 having a two-dimensional layered structure in which a strong bond is provided by a covalent bond in an in-plane direction and a weak bond is provided by an ionic bond or a van der Waals bond in a b-axis (e.g., out-of-plane) direction:

$$(R_{1-a}R'_a)(T_{1-b}T'_b)_{3\pm y}$$ Formula 1 wherein R and R' are different from each other, and each comprises at least one element selected from a rare-earth element and a transition metal, T and T' are different from each other, and each comprises at least one element selected from sulfur (S), selenium (Se), tellurium (Te), phosphorus (P), arsenic (As), antimony (Sb), bismuth (Bi), carbon (C), silicon (Si), germanium (Ge), tin (Sn), boron (B), aluminum (Al), gallium (Ga), and indium (In), $0 \leq a \leq 1$, $0 \leq b \leq 1$, and $0 \leq y < 1$.

Figure 3:
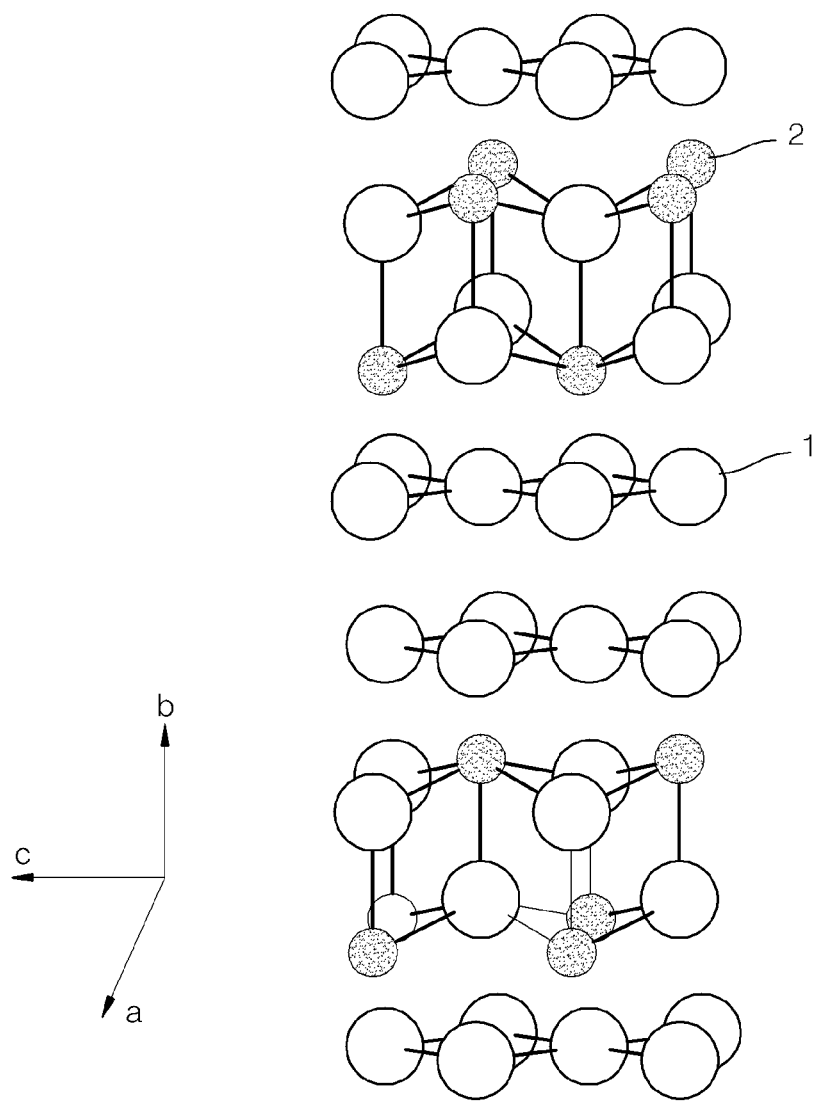
FIG. 3 is a schematic diagram of a crystal structure of an embodiment of a thermoelectric material.

As shown in FIG. 3, the thermoelectric material has a two-dimensional layered structure in which a double layer consisting essentially of component T and T'1 is interposed between block layers, each block layer consisting essentially of component R and R'2 and Component T and T'. As shown in FIG. 3 and while not wanting to be bound by theory, it is believed that the two-dimensional layer structure results in two-dimensional conducting characteristics. In addition, the thermoelectric material may have a two-dimensional or one-dimensional lattice distortion in an in-plane direction and may have an aligned (e.g., undistorted) structure in a b-axis (e.g., out-of-plane) direction. In another embodiment, the thermoelectric material has a two-dimensional layered structure in which a double layer comprising component T and T'1 is interposed between block layers, each block layer comprising component R and R'2 and Component T and T'. In another embodiment, the thermoelectric material has a two-dimensional layered structure in which a double layer consisting of component T and T'1 is interposed between block layers, each block layer consisting of component R and R'2 and Component T and T'.

For example, a trichalcogenide compound consisting of a rare-earth element as component R and a chalcogen element as component T may have a high density of states in the vicinity of Fermi energy by selecting a localized f-electron to have an energy level similar to the Fermi energy. In addition, since the trichalcogenide compound has R-T block layers above and below the double layer consisting essentially of component T, an electron-hole Seebeck coefficient offset effect between a single T-layer of the double layer and the R-T block layer may be substantially or effectively prevented, thereby enabling an increase in the Seebeck coefficient. In addition, since a charge density wave is generated due to a strong interaction between an electron and the lattice, the lattice thermal conductivity is reduced and thus the performance index is increased. In addition, in the thermoelectric material, hole density is increased and an electron-hole offset effect is substantially or effectively prevented, thereby further increasing a Seebeck coefficient.

In the thermoelectric material represented by Formula 1, R and R' are different from each other, and may each comprise at least one element selected from a rare-earth element and a transition metal. The transition metal may be a metal of Groups 3 to 12 of the Periodic Table of the Elements. The rare-earth element may be selected from yttrium (Y), cerium (Ce), and lanthanum (La), and the transition metal may be selected from Ni, Cu, Zn, Ag, Sc, Y, Ti, Zr, Hf, V, Nb, Ta, Cr, Mo, W, Mn, Fe, Co, Cu, Zn, Ag, and Re. In another embodiment, the rare-earth element may be cerium (Ce), and the transition metal may be selected from Ni, Cu, Zn, Ag, Sc, Y, Ti, Zr, Hf, V, Nb, and Re. In another embodiment, the rare-earth element may be cerium (Ce), and the transition metal may be selected from Ni, Cu, Zn, Ag, and Re.

According to an embodiment, at least one of R and R' may include a rare-earth element. For example, the rare-earth element may be Ce.

In the thermoelectric material represented by Formula 1, a represents a mole fraction of R', and may be equal to or greater than 0 and less than or equal to about 1, specifically 0 to about 0.8, more specifically 0 to about 0.5. In another embodiment, a is about 0.1 to about 1, specifically 0.2 to about 0.8, more specifically about 0.3 to about 0.6.

In the thermoelectric material represented by Formula 1, T and T' are different from each other, and may each comprise at least one element selected from S, Se, Te, P, As, Sb, Bi, C, Si, Ge, Sn, B, Al, Ga, and In. In another embodiment, T and T' each comprise at least one element selected from S, Se, Te, P, As, Sb, Bi, and In.

According to an embodiment, at least one of T and T' may comprise at least one chalcogen element, for example, at least one element selected from S, Se, and Te. In the thermoelectric material represented by Formula 1, b is a mole fraction of T', and may be equal to or greater than 0 and less than or equal to about 1, specifically 0 to about 0.8, more specifically 0 to about 0.5. In another embodiment, b is about 0.1 to about 1, specifically 0.2 to about 0.8, more specifically about 0.3 to about 0.6.

In Formula 1, the mole fraction of the sum of components T and T' (i.e., 3±y in Formula 1) may be greater than about 2.0 moles ("mol") and less than about 4.0 mol, specifically about 2.1 mol to about 3.9 mol, more specifically about 2.5 mol to about 3.5 mol, based on 1 mole of the sum of components R and R'. For example, the mole fraction of the sum of components T and T' may be greater than about 2.0 mol and less than or equal to about 3.0 mol, or about 2.5 mol to about 3.0 mol, based on 1 mole of the sum of components R and R'. Alternatively, the mole fraction of the sum of components T and T' may be equal to or greater than about 3.0 mol and less than about 4.0 mol, specifically about 3.0 mol to about 3.5 mol, or about 3.0 mol to about 3.2 mol, based on 1 mole of the sum of components R and R'.

In an embodiment, y in Formula 1 may be 0 to about 1, specifically about 0.1 to about 0.9, more specifically about 0.2 to about 0.8, or about 0.3 to about 0.7, or about 0.4 to about 0.6, or about 0.5.

In the thermoelectric material represented by Formula 1, R' and T' may be doping elements and the electrical conductivity and the Seebeck coefficient may be increased by changing the type or amount of R and T. For example, when two band conduction (e.g., where electrons and holes co-exist) occurs, an electron or a hole may have conducting properties upon substitution of some R with R', thereby selecting a current density of a thermoelectric material. Component R' and component T' each independently may be a one-component system, a two-component system, or a three-component system. When either component R' or component T' are a two-component system, the mole ratio of the two components may be about 1:9 to about 9:1, specifically about 2:8 to about 8:2, more specifically about 3:7 to about 7:3. Thus in an embodiment R' may comprise R'$_1$ and R'$_2$, and R'$_1$ and R'$_2$ may have a mole ratio of about 1:9 to about 9:1, specifically about 2:8 to about 8:2, more specifically about 3:7 to about 7:3. Also T' may comprise T'$_1$ and T'$_2$, and T'$_1$ and T'$_2$ may have a mole ratio of about 1:9 to about 9:1, specifically about 2:8 to about 8:2, more specifically about 3:7 to about 7:3.

Also, and when any of components R' and T' are a three-component system, the mole ratio of the three components may be about 1:0.1:9.0 to about 9:0.1:1 respectively, but is not limited thereto. Thus in an embodiment R' may comprise R'$_1$, R'$_2$, and R'$_3$, and R'$_1$, R'$_2$, and R'$_3$ may have a mole ratio of about 1:0.1:9.0 to about 9:0.1:1 respectively, specifically about 2:0.1:8.0 to about 8:0.1:2 respectively. Also, T' may comprise T'$_1$, T'$_2$, and T'$_3$, and T'$_1$, T'$_2$, and T'$_3$ may have a mole ratio of about 1:0.1:9.0 to about 9:0.1:1 respectively, specifically about 2:0.1:8.0 to about 8:0.1:2 respectively.

For example, when a transition metal is included, doped in, or inserted to a CeTe$_3$-type thermoelectric material, an atomic energy of a localized f-electron of a rare-earth element may be selected. Thus, when an f-electron energy band is selected to be a Fermi surface, a high Seebeck coefficient may be obtained.

As further disclosed above and while not wanting to be bound by theory, it is believed that the thermoelectric material has a low thermal conductivity and also a lattice distortion occurring due to two-dimensional conducting characteristics. In addition, since a layer consisting essentially of component T, which carries holes, is a double layer, a material having a high electrical conductivity and a large Seebeck coefficient is provided.

Accordingly, in an embodiment, a thermoelectric material having a large thermoelectric performance index ("ZT"), for example, at room temperature, is provided. In this regard, the thermoelectric material may have a value of ZT of at least about 0.05, specifically at least about 0.1, more specifically at least about 0.2 at a temperature of about 600 K or less, specifically about 550 K or less, more specifically about 400 K or less. For example, the thermoelectric material may have a value of ZT of at least about 0.05, specifically at least about 0.1, more specifically at least about 0.2 at room temperature or at a temperature of about 200 K to about 400 K, or about 250 K to about 350 K.

A thermoelectric material according to another embodiment comprises a compound represented by Formula 2:

$$(R_{1-a'}R'_{a'})(T_{1-b'}T'_{b'})_{3-y'} \qquad \text{Formula 2}$$

wherein R is a rare-earth element, R' is transition metal, T is at least one element selected from S, Se, and Te, T' comprises at least one selected from P, As, Sb, Bi, C, Si, Ge, Sn, B, Al, Ga, and In, $0 \leq a' \leq 1$, $0 \leq b' \leq 1$, and y'$0 \leq y' \leq 1$.

According to an embodiment, in the compound represented by Formula 2, R is Ce and T is Te.

According to an embodiment, in the compound represented by Formula 2, $0 \leq a' \leq 0.5$, specifically $0.1 \leq a' \leq 0.4$, or $0.2 \leq a' \leq 0.3$.

In an embodiment $0 \leq b' \leq 0.5$, specifically $0.1 \leq b' \leq 0.4$, or $0.2 \leq b' \leq 0.3$.

According to an embodiment, in the compound represented by Formula 2, $0 \leq y' \leq 0.8$, specifically $0 \leq y' \leq 0.5$, more specifically $0 \leq y' \leq 0.3$.

According to an embodiment, the thermoelectric material including the compound represented by Formula 1 may have a thermal conductivity of about 3.5 Watts per meter Kelvin (W/mK) or less, specifically about 3 W/mK or less, more specifically about 2 W/mK or less, or about 1 to about 1.5 W/mK or less.

In addition, the thermoelectric material including the compound represented by Formula 1 may have a Seebeck coefficient of 5 microvolts per Kelvin (µV/K) or more, specifically about 10 µV/K or more, more specifically about 30 µV/K or more, or about 50 µV/K or more. For example, the thermoelectric material including the compound represented by Formula 1 may have a thermal conductivity of about 50 µV/K to about 100 µV/K.

In addition, the thermoelectric material including the compound represented by Formula 1 may have a Performance index ("ZT") of about 0.05, specifically about 0.1.

The thermoelectric material may have a polycrystalline structure or a monocrystalline structure. In an embodiment, the thermoelectric material is monocrystalline.

Examples of a method of synthesizing thermoelectric materials including a polycrystalline structure include:
a method using an ampoule, in which a source material (e.g., element) is loaded into a quartz ampoule or a metal tube, the gas in the ampoule is evacuated, the ampoule sealed, and the ampoule heat-treated;
an arc melting method in which a source material (e.g., element) is loaded into a chamber and then melted by arc discharging under an inert gas atmosphere; and
a method using a solid state reaction, in which source material in the form of a powder is, in one method, sufficiently combined and then processed (e.g., pressed) to obtain a hard product (e.g., a pellet) and then the obtained hard product is heat-treated, or in another method, the combined powder is heat-treated, processed, and then sintered.

However, the thermoelectric material having a polycrystalline structure may also be synthesized using other methods.

Examples of a method of synthesizing the thermoelectric material having a monocrystalline structure include:
a metal flux method for crystal growth, in which a source material (e.g., element) and a material (e.g., element) that provides a condition under which the source material may sufficiently grow into a crystal at a high temperature are loaded into a crucible and then heat-treated at high temperature;
a Bridgeman method for crystal growth, in which a source material (e.g., element) is loaded into a crucible and then an end of the crucible is heated at a high-temperature until the source material is melted, and then, the high temperature region is slowly shifted, thereby locally melting the source material until substantially the entirety of the source material is exposed to the high-temperature region;
a zone melting method for crystal growth in which source a material (e.g., element) is formed in the shape of a seed rod and a feed rod and then the melting zone is slowly shifted upward to grow a crystal; and
a vapor transport method for crystal growth, in which source a material is loaded into a lower portion of a quartz tube and then the lower portion of the quartz tube is heated while a top portion of the quartz tube is maintained at low temperature. Thus, as the source material is evaporated, a solid phase reaction occurs at low temperature, growing a crystal.

However, a thermoelectric material including a monocrystalline structure may also be synthesized using other methods.

The thermoelectric material may be prepared using any of the methods described above.

In addition, the thermoelectric material including a polycrystalline structure may further undergo a densification process. A densification process may provide an increase in electrical conductivity.

Examples of a densification process include:
a hot pressing method, in which a compound in the form of a powder is loaded into a mold having a predetermined shape and then, molded at high temperature of, for example, about 300 to about 800° C. and under high pressure of, for example, about 30 to about 300 megaPascals (MPa);
a spark plasma sintering method, in which a compound in the form of a powder is sintered for a short period of time at a high voltage and/or a high current and under high pressure, for example, at current of about 50 A to about 500 A under a pressure of about 30 MPa to about 300 MPa; and
a hot pressing method, in which a powder is press-molded by extrusion-sintering at a high temperature, for example, at about 300 to about 700° C.

Due to the densification process, the thermoelectric material have a density of about 70 to about 100% of a theoretical density. The theoretical density is calculated by dividing a molecular weight with an atomic volume and evaluated as a lattice constant. For example, the densified thermoelectric material may have a density of about 95 to about 100%, and correspondingly has a higher electrical conductivity.

A thermoelectric element according to an embodiment may be obtained by molding, or for example, by cutting a thermoelectric material. If the thermoelectric material has a monocrystalline structure, the cutting direction of the thermoelectric material may be perpendicular to a growth direction of the thermoelectric material.

The thermoelectric element may be a p-type thermoelectric element or an n-type thermoelectric element. The thermoelectric element may be a thermoelectric composite structure having a predetermined shape, for example, a thermoelectric composite structure having a rectilinear shape, specifically parallelepiped shape.

In addition, the thermoelectric element may be connected to an electrode and may generate a cooling effect when a current is applied thereto, and may generate power using heat from a device or other temperature difference.

Figure 4:
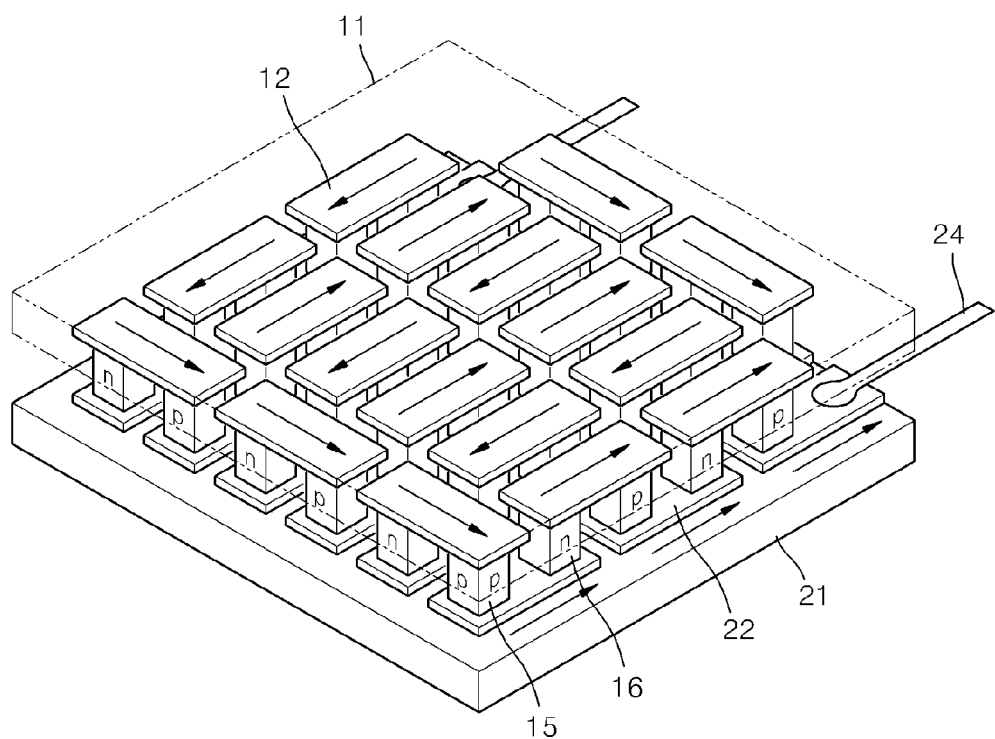
FIG. 4 is a schematic diagram of an exemplary embodiment of a thermoelectric module.

FIG. 4 is a schematic diagram of an embodiment of a thermoelectric module including the thermoelectric element. Referring to FIG. 4, a top electrode 12 and a bottom electrode 22 are disposed on a top insulating substrate 11 and a bottom insulating substrate 21, respectively, and the top electrode 12 and the bottom electrode 22 contact a p-type thermoelectric element 15 and an n-type thermoelectric element 16. The top electrode 12 and the bottom electrode 22 are connected externally by a lead electrode 24.

The top and bottom insulating substrates 11 and 21 may comprise at least one element selected from gallium arsenic (GaAs), sapphire, silicon, FIREX, and quartz. The top and bottom electrodes 12 and 22 may comprise at least one element selected from aluminum, nickel, gold, and titanium, and may have various sizes. The top and bottom electrodes 12 and 22 may be formed with various known patterning methods, such as a lift-off semiconductor process, a deposition method, or a photolithography method.

Figure 2:
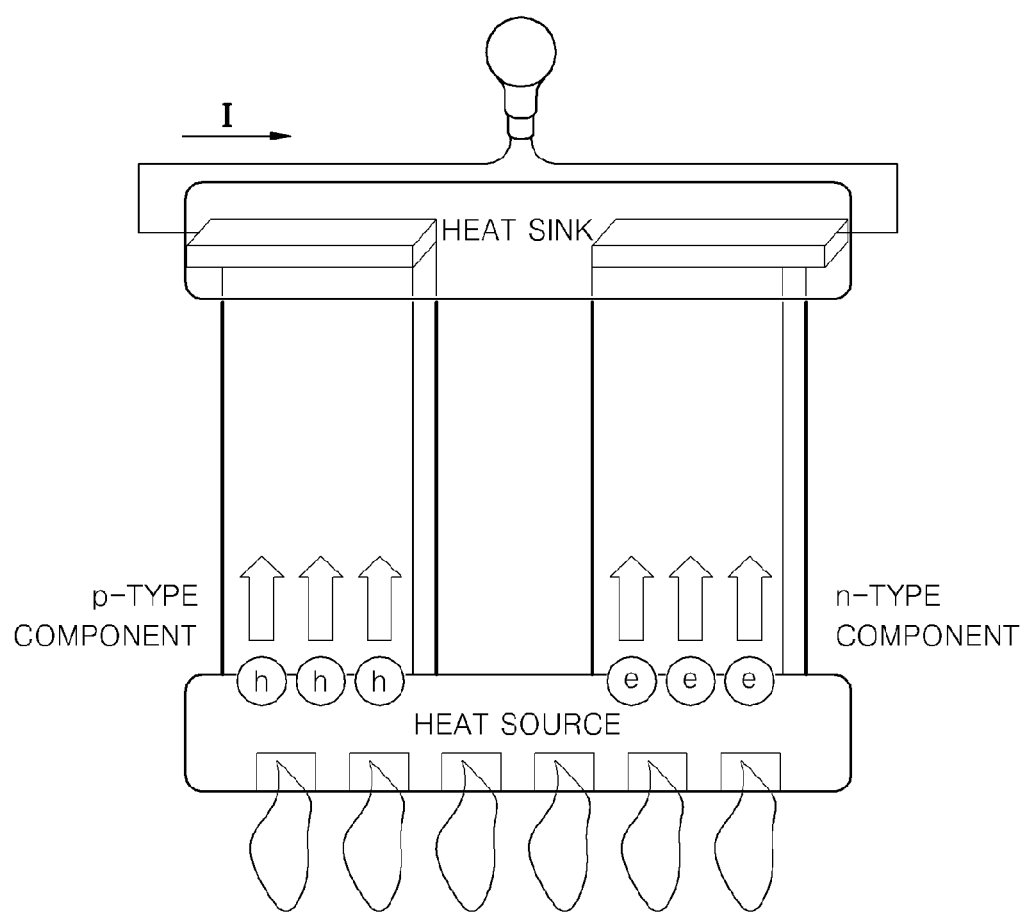
FIG. 2 is a schematic diagram of a thermoelectric power generator using the Seebeck effect.

A thermoelectric module according to another embodiment, as illustrated in FIGS. 1 and 2, includes a first electrode, a second electrode, and a thermoelectric material that is interposed between the first and second electrodes and represented by Formula 1. The thermoelectric module may further include an insulating substrate on which at least one electrode of the first electrode and the second electrode is located as illustrated in FIG. 4. The insulating substrate may be the same as described above.

In a thermoelectric module according to an embodiment, one of the first electrode and the second electrode may be exposed to a heat source, which may be directed to a heat supply member, as illustrated in FIGS. 1 and 2. In a thermoelectric element according to an embodiment, one of the first electrode and the second electrode may be electrically connected to an electric power supply as illustrated in FIG. 1, wherein the electric power supply may be outside of a thermoelectric module. The electric power supply may be an electrical device that consumes or stores electric power, such as a battery, for example.

In a thermoelectric module according to an embodiment, one of the first electrode and the second electrode may be electrically connected to an electric power supply as illustrated in FIG. 1.

In a thermoelectric module according to an embodiment, a p-type thermoelectric element and an n-type thermoelectric element may be alternately aligned as illustrated in FIG. 4, and at least one of the p-type thermoelectric element and the n-type thermoelectric element may comprise the thermoelectric material including the compound represented by Formula 1.

A thermoelectric device according to an embodiment includes a heat supply member and the thermoelectric module, wherein the thermoelectric module includes a thermoelectric material which absorbs heat from the heat supply member and comprises the trichalcogenide compound represented by Formula 1, a first electrode, and a second electrode, wherein the second electrode faces the first electrode. One of the first electrode and the second electrode may contact the thermoelectric material.

An example of the thermoelectric device may further include an electric power supply electrically connected to the first electrode and the second electrode. Another example of the thermoelectric device may further include an electric power supply electrically connected to one of the first electrode and the second electrode.

The thermoelectric material, the thermoelectric element, the thermoelectric module, and the thermoelectric device may be, for example, a thermoelectric cooling system or a thermoelectric power generation system. The thermoelectric cooling system may be a micro-cooling system, a consumer cooling device, an air conditioner, or a waste heat power generation system, but is not limited thereto. The structure and manufacturing method of the thermoelectric cooling system are well known in the art and can be determined without undue experimentation, and thus will not be described in further detail herein.

An embodiment will be described in further detail with reference to the following examples. These examples are for illustrative purposes only and are not intended to limit the scope of the disclosed embodiment.

Example 1

Ce and Te were quantified in a mole ratio of 1:3, and then placed in an evacuated quartz ample, and heat treated at a temperature of 850° C. for 24 hours, thereby synthesizing $CeTe_{3.0}$. The mole ratios of Ce and Te of the synthesized compound was identified by inductively coupled plasma spectroscopy.

Example 2

$CeTe_{2.7}$ was synthesized in the same manner as in Example 1, except that Ce and Te were quantified in a mole ratio of 1:2.7 instead of 1:3.

Example 3

$CeTe_{2.9}$ was synthesized in the same manner as in Example 1, except that Ce and Te were quantified in a mole ratio of 1:2.9 instead of 1:3.

Example 4

$CeTe_{3.1}$ was synthesized in the same manner as in Example 1, except that Ce and Te were quantified in a mole ratio of 1:3.1 instead of 1:3.

Example 5

$CeTe_{3.2}$ was synthesized in the same manner as in Example 1, except that Ce and Te were quantified in a mole ratio of 1:3.2 instead of 1:3.

Experimental Example 1

Evaluation of Thermal Conductivity

Figure 5:
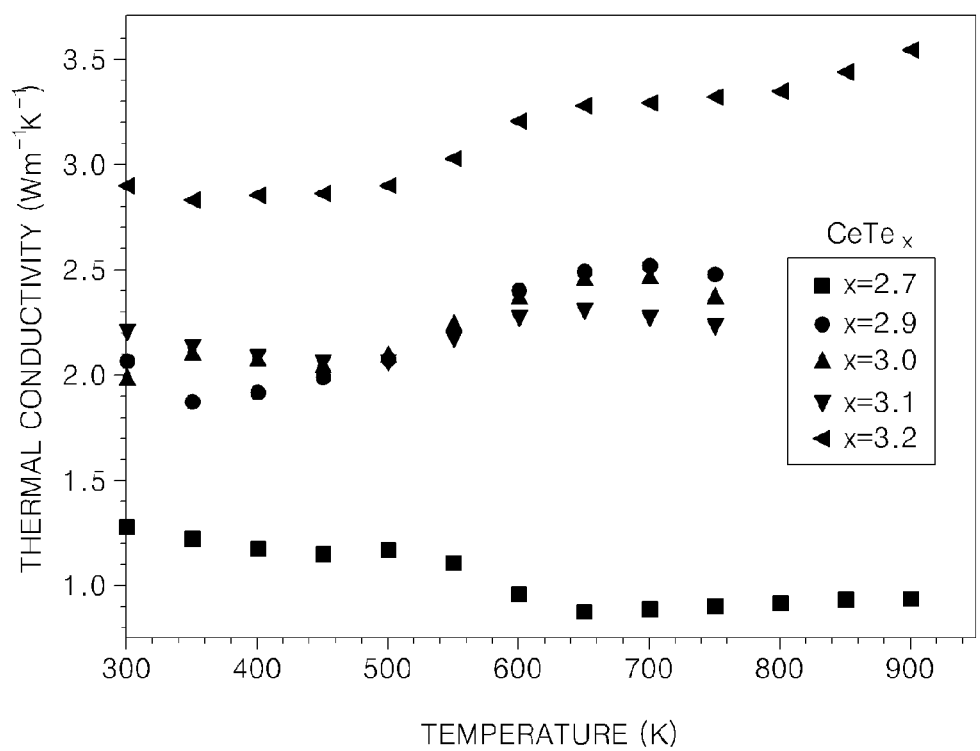
FIG. 5 is a graph of temperature (Kelvin, K) versus thermal conductivity (Watts per meter Kelvin) showing the thermal conductivity as measured in Experimental Example 1 of the thermoelectric materials prepared according to Examples 1 to 5.

Thermal conductivities of the thermoelectric materials $CeTe_{2.7}$, $CeTe_{2.9}$, $CeTe_{3.0}$, $CeTe_{3.1}$ and $CeTe_{3.2}$ prepared according to Examples 1-5 were measured and the results are shown in FIG. 5. The thermal conductivities of the thermoelectric materials were about 3 W/mK or less, for example, in the range of about 1.3 to about 2.9 W/mK. In this regard, the thermal conductivities were obtained by evaluating thermal diffusivity measured using a laser flash method.

The crystal structure of $CeTe_3$ is illustrated in FIG. 3. In FIG. 3 the open circles represent the T and T' atoms and the stippled circles represent the R and R' atoms. In the thermoelectric material and while not wanting to be bound by theory, it is believed that a Ce—Te block is interposed between Te-double layers, a strong bond is formed in an a-c plane due to a covalent bond, and a weak bond is formed in a b-axis direction due to a van der Waals interaction. It is also believed that the anisotropic characteristics of the crystal bonding forces greatly contribute to a reduction of the thermal conductivity of the thermoelectric material. Thus, the prepared thermoelectric material has low thermal conductivity.

Experimental Example 2

Evaluation of Seebeck Coefficient

Figure 6:
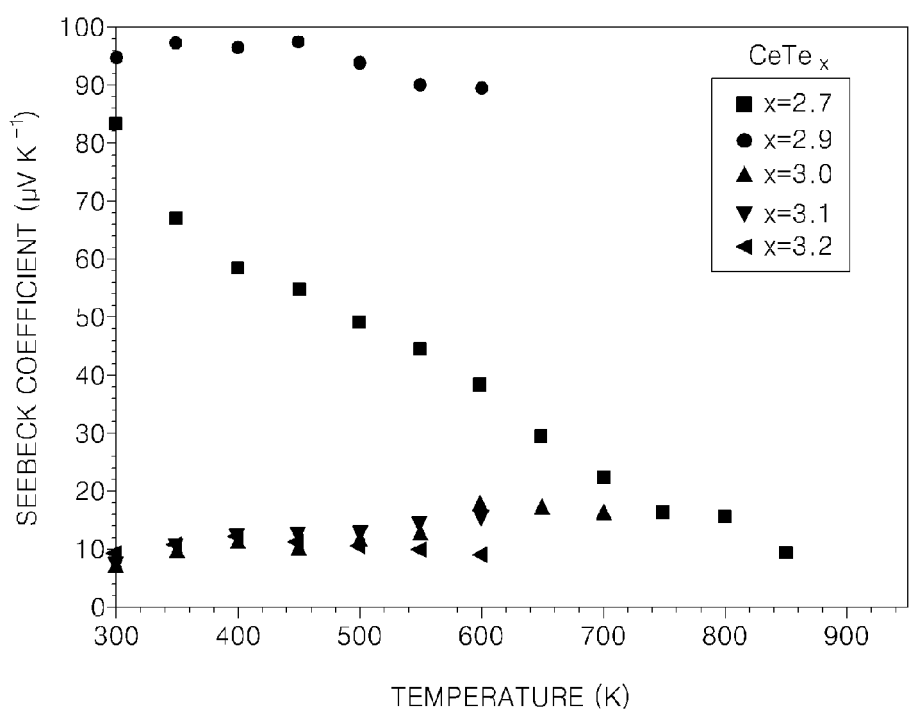
FIG. 6 is a graph of temperature (Kelvin, K) versus Seebeck coefficient (microvolts per Kelvin) showing the Seebeck coefficient as measured in Experimental Example 2 of the thermoelectric materials prepared according to Examples 1 to 5.

Seebeck coefficients of the thermoelectric materials $CeTe_{2.7}$, $CeTe_{2.9}$, $CeTe_{3.0}$, $CeTe_{3.1}$ and $CeTe_{3.2}$ prepared according to Examples 1-5 were measured, and the results are shown in FIG. 6. The Seebeck coefficients were measured by using a 4-terminal method.

For a $CeTe_{3.0}$ compound that constitutes the thermoelectric material and while not wanting to be bound by theory, it is believed that the Seebeck coefficient is increased by increasing content of a trichalcogenide layer, in which holes flow, thereby increasing a hole density. The Seebeck coefficients of the thermoelectric materials prepared according to Examples 1-5 are about 5 µV/K or more, and at room temperature, as illustrated in FIG. 6, for example, are about 80 µV/K or more.

Experimental Example 3

Calculation of Performance Index ("ZT")

Figure 7:
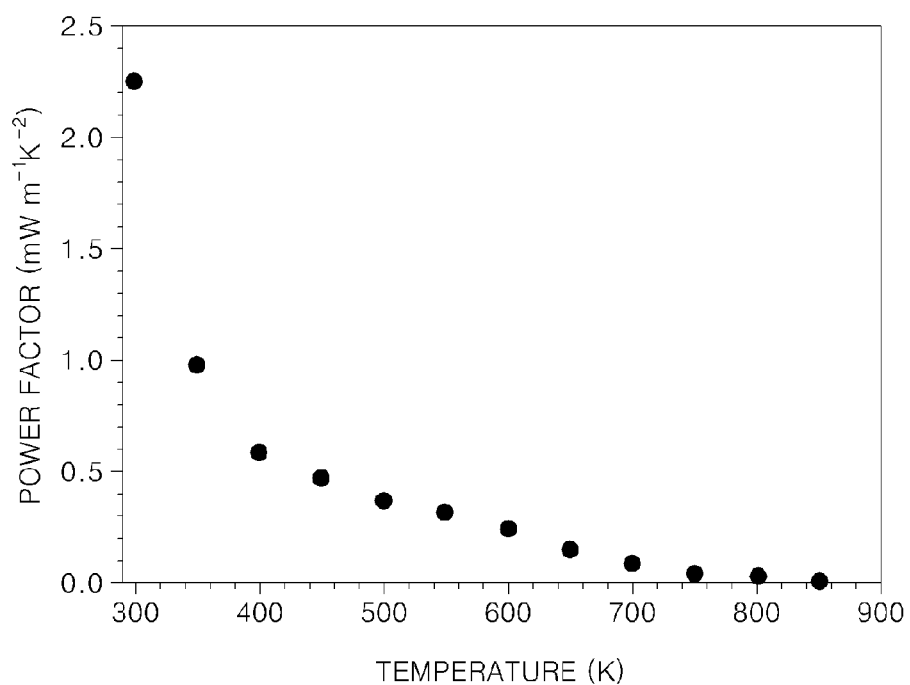
FIG. 7 is a graph of temperature (Kelvin, K) versus power factor (milliWatts per meter Kelvin squared, $mWm^{-1}K^{-2}$) showing the power factor of a thermoelectric material prepared according to Experimental Example 1.
Figure 8:
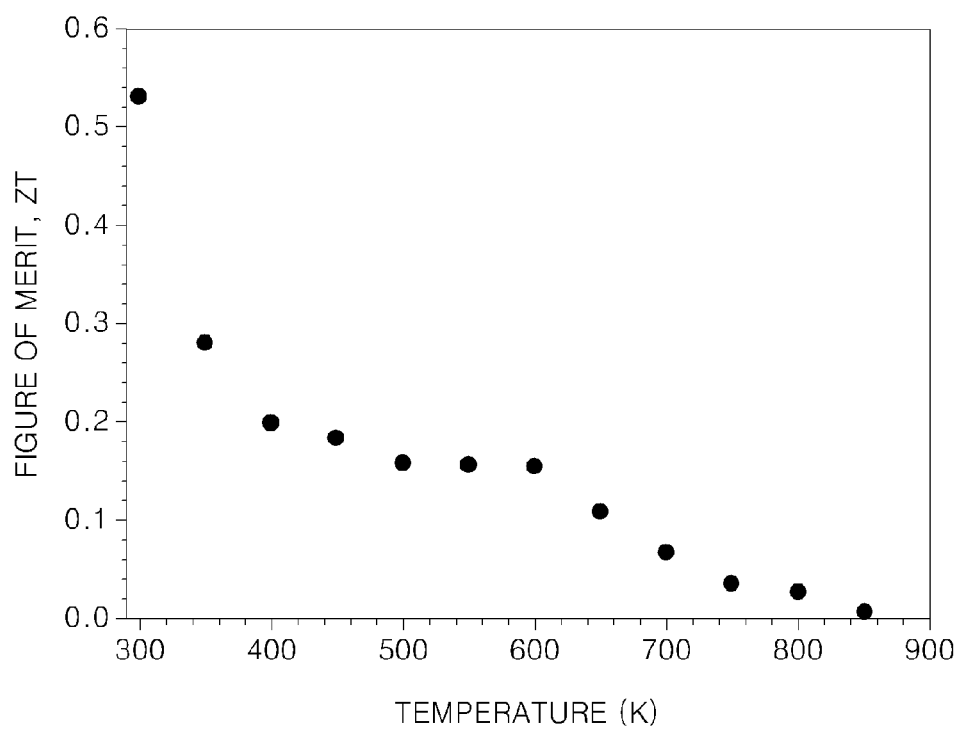
FIG. 8 is a graph of temperature (Kelvin, K) versus a performance index ("ZT") of a thermoelectric material prepared according to Experimental Example 1.

A power factor and performance index of $CeTe_{2.7}$ prepared according to Example 2 were calculated using the results obtained according to Experimental Examples 1 to 3 and the results are shown in FIG. 7 and FIG. 8, respectively.

Due to the high electrical conductivity of the thermoelectric material, as illustrated in FIG. 7, the power factor is as high as about 2.25 $mW/mK^2$ or more. The value of ZT is, as illustrated in FIG. 8, is about 0.53 at room temperature.

Although at a higher temperature the thermoelectric material has a lower ZT, the ZT is sufficiently high even at room temperature (e.g., 300 K), and a much higher ZT may be obtained by lowering the thermal conductivity by distorting a lattice with a charge density wave by selecting a current density or forming a monocrystalline structure.

It should be understood that the exemplary embodiments described herein should be considered in a descriptive sense only and not for purposes of limitation. Descriptions of features or aspects within each embodiment should be considered as available for other similar features or aspects in other embodiments.

What is claimed is:

1. A thermoelectric material comprising:
a compound represented by Formula 1 below:

$$(R_{1-a}R'_a)(T_{1-b}T'_b)_{3\pm y} \qquad \text{Formula 1}$$

wherein R and R' are different from each other, and each of R and R' comprises at least one element selected from a rare-earth element and a transition metal,
T and T' are different from each other, and each of T and T' comprises at least one element selected from sulfur, selenium, tellurium, phosphorus, arsenic, antimony, bismuth, carbon, silicon, germanium, tin, boron, aluminum, gallium, and indium, $0 \leq a \leq 1$, $0 \leq b \leq 1$, and $0.1 < y < 1$, wherein the compound of Formula 1 has a structure comprising a double layer consisting essentially of at least one of T and T' interposed between block layers, and wherein each block layer consists essentially of at least one of R and R' and at least one of T and T'.

2. The thermoelectric material of claim 1, wherein the compound represented by Formula 1 has a structure comprising a two-dimensional layered structure.

3. The thermoelectric material of claim 1, wherein any one of R and R' comprises a rare-earth element.

4. The thermoelectric material of claim 1, wherein any one of T and T' comprises at least one element selected from S, Se, and Te.

5. The thermoelectric material of claim 1, wherein a is 0 to about 0.5.

6. The thermoelectric material of claim 1, wherein b is 0 to about 0.5.

7. The thermoelectric material of claim 1, wherein y is greater than 0 to about 0.5.

8. The thermoelectric material of claim 1, wherein the compound represented by Formula 1 is a compound represented by Formula 2 below:

$$(R_{1-a'}R'_{a'})(T_{1-b'}T'_{b'})_{3-y'} \qquad \text{Formula 2}$$

wherein
R is a rare-earth element,
R' is transition metal,
T is at least one element selected from S, Se, and Te,
T' comprises at least one element selected from P, As, Sb, Bi, C, Si, Ge, Sn, B, Al, Ga, and In, $0 \leq a' \leq 1$, $0 \leq b' \leq 1$, and $0.1 < y' < 1$.

9. The thermoelectric material of claim 8, wherein y' is equal to or greater than 0 and less than or equal to about 0.5.

10. The thermoelectric material of claim 1, wherein the compound represented by Formula 1 has a polycrystalline structure or a monocrystalline structure.

11. The thermoelectric material of claim 1, wherein the thermoelectric material has a thermal conductivity of about 3.5 Watts per meter Kelvin or less at 300 Kelvin.

12. The thermoelectric material of claim 1, wherein the thermoelectric material has a Seebeck coefficient of about 5 microvolts per Kelvin or greater at 300 Kelvin.

13. The thermoelectric material of claim 1, wherein the thermoelectric material has a performance index of about 0.05 or greater at 300 Kelvin.

14. The thermoelectric material of claim 1,
wherein R' comprises R'$_1$ and R'$_2$, and R'$_1$ and R'$_2$ have a mole ratio of about 1:9 to about 9:1, and
wherein T' comprises T'$_1$ and T'$_2$, and T'$_1$ and T'$_2$ have a mole ratio of about 1:9 to about 9:1.

15. A thermoelectric module comprising:
a first electrode, a second electrode, and a thermoelectric element interposed between the first electrode and the second electrode,
wherein the first electrode contacts the thermoelectric element and is proximate to a heat supply member,
wherein the second electrode contacts the thermoelectric element and is proximate to a heat sink member, and wherein
the thermoelectric element comprises a thermoelectric material comprising a compound represented by Formula 3 below:

$$(R_{1-a}R'_a)(T_{1-b}T'_b)_{3\pm y} \qquad \text{Formula 3}$$

wherein R and R' are different from each other, and each of R and R' comprises at least one element selected from a rare-earth element and a transition metal,
T and T' are different from each other, and each of T and T' comprises at least one element selected from sulfur, selenium, tellurium, phosphorus, arsenic, antimony, bismuth, carbon, silicon, germanium, tin, boron, aluminum, gallium, and indium, $0 \leq a \leq 1$, $0 \leq b \leq 1$, and $0 \leq y < 1$, wherein the compound of Formula 3 has a structure comprising a double layer consisting essentially of at least one of T and T' interposed between block layers, and wherein each block layer consists essentially of at least one of R and R' and at least one of T and T'.

16. A thermoelectric device comprising:
a heat supply member; and
a thermoelectric module comprising:
a thermoelectric element which absorbs heat from the heat supply member;
a first electrode contacting the thermoelectric element and proximate to the heat supply member; and
a second electrode facing the first electrode and contacting the thermoelectric element and proximate to a heat sink member, wherein
the thermoelectric element comprises a thermoelectric material comprising a compound represented by Formula 3 below:

$$(R_{1-a}R'_a)(T_{1-b}T'_b)_{3\pm y} \qquad \text{Formula 3}$$

wherein R and R' are different from each other, and each of R and R' comprises at least one element selected from a rare-earth element and a transition metal,
T and T' are different from each other, and each of T and T' comprises at least one element selected from sulfur, selenium, tellurium, phosphorus, arsenic, antimony, bismuth, carbon, silicon, germanium, tin, boron, aluminum, gallium, and indium, $0 \leq a \leq 1$, $0 \leq b \leq 1$, and $0 \leq y < 1$, wherein the compound of Formula 3 has a structure comprising a double layer consisting essentially of at least one of T and T' interposed between block layers, and wherein each block layer consists essentially of at least one of R and R' and at least one of T and T'.

17. A method of manufacturing a thermoelectric material, the method comprising:
combining a first material and a second material to form a combination; and
heat treating the combination to form the thermoelectric material,
wherein
the first material comprises R and R', R and R' are different from each other, and each of R and R' comprises at least one element selected from a rare-earth element and a transition metal,
the second material comprises T and T', T and T' are different from each other, and each of T and T' comprises at least one element selected from sulfur, selenium, tellurium, phosphorus, arsenic, antimony, bismuth, carbon, silicon, germanium, tin, boron, aluminum, gallium, and indium, and
a mole ratio of a sum of R and R' to a sum of T and T' is about 1:2 to about 1:4, and wherein the thermoelectric material is represented by Formula 1 below:

$$(R_{1-a}R'_a)(T_{1-b}T'_b)_{3 \pm y} \qquad \text{Formula 1}$$

wherein R and R' are different from each other, and each of R and R' comprises at least one element selected from a rare-earth element and a transition metal,
T and T' are different from each other, and each of T and T' comprises at least one element selected from sulfur, selenium, tellurium, phosphorus, arsenic, antimony, bismuth, carbon, silicon, germanium, tin, boron, aluminum, gallium, and indium, $0 \leq a \leq 1$, $0 \leq b \leq 1$, and $0.1 < y < 1$, wherein the compound of Formula 1 has a structure comprising a double layer consisting essentially of at least one of T and T' interposed between block layers, and wherein each block layer consists essentially of at least one of R and R' and at least one of T and T'.

* * * * *